United States Patent [19]

Lang et al.

[11] 4,318,059

[45] Mar. 2, 1982

[54] SEMICONDUCTOR LASER DEVICE HAVING PLURAL ACTIVE REGIONS

[75] Inventors: Hi-Roy-Oshi Lang; Shigeo Matsushita, both of Tokyo, Japan

[73] Assignee: Nippon Electric Co., Ltd., Tokyo, Japan

[21] Appl. No.: 159,382

[22] Filed: Jun. 13, 1980

[30] Foreign Application Priority Data

Jun. 13, 1979 [JP] Japan ................... 54-73466

[51] Int. Cl.³ .............................................. H01S 3/19
[52] U.S. Cl. ........................................ 372/47; 357/17; 372/50
[58] Field of Search ................. 331/94.5 H; 357/17, 357/18

[56] References Cited

U.S. PATENT DOCUMENTS 4,277,759 7/1981 Tanaka et al. ............... 331/94.5 H
4,280,108 7/1981 Scifres et al. ............... 331/94.5 H
4,280,131 7/1981 Ono et al. ...................... 357/17

OTHER PUBLICATIONS

Namizaki, "Transverse-Junction-Stripe Lasers with a GaAs p-n Homojunction", IEEE J. of Quantum Electronics, vol. QE-11, No. 7, Jul. 1975, pp. 427-431.
Aiki et al., "Frequency Multiplexing Light Source with Monolithically Integrated Distributed-Feedback Diode Lasers", APL, vol. 29, No. 8, 15 Oct. 1976, pp. 506-508.
Panish, "Phase Equilibria in the System Al-Ga-As-Sn and Electrical Properties of Sn-Doped Liquid Phase Epitaxial $Al_xGa_{1-x}As$", J. Appl. Phys., vol. 44, No. 6, Jun. 1973, pp. 2667-2675.

Primary Examiner—James W. Davie
Attorney, Agent, or Firm—Hopgood, Calimafde, Kalil, Blaustein & Judlowe

[57] ABSTRACT

A monolithically integrated semiconductor laser device capable of producing a plurality of light beams different in wavelength from each other.

2 Claims, 5 Drawing Figures

SEMICONDUCTOR LASER DEVICE HAVING PLURAL ACTIVE REGIONS

FIELD OF THE INVENTION

The present invention concerns a semiconductor laser having a double heterostructure (DH structure), and more particularly it concerns a semiconductor laser device having a plurality of light emitting regions.

DESCRIPTION OF THE PRIOR ART

The semiconductor injection laser device is compact, light in weight and easily produced on a mass production scale. Therefore it plays an important role as the light source in the fields of optical communication and optical information processing. Among semiconductor lasers, those having a DH structure can radiate efficiently and operate continuously at room temperature. Thus, DH structure devices have come to be widely used in communication systems using optical fibers.

System, employing wavelength multiplex transmission,

In an optical fiber communication, it is necessary to apply, the plural number of carrier wave laser beams, each having a different wavelength, to a single transmission optical fiber. To accomplish this objective there are provided an equal number of semiconductor laser devices and output fibers. The output fibers are optically coupled with the laser devices with the output fibers being optically combined at the opposite end. This system requires not only numerous semiconductor laser devices, but also additional labor in connecting the laser devices with the optical fibers, and further combining the connected plural number of optical fibers into a single optical fiber. Also, of course the total losses at the optical couplings tend to be large.

As one approach for removing these adverse effects, there is proposed a structure wherein a plurality of laser diodes of the distributed-feedback type are formed on the same substrate. Such a structure is described in an article by A. Aiki et al in Applied Physics Letters, Vol. 29, No. 8, Oct. 15, 1976, pp. 506–508. This device has many advantages, including the stabilization of wavelengths by the distributed-feedback structure, and a substantial reduction in man-hours required for production due to the integration of lasers on the same substrate.

Although the Aiki et al structure does have advantages, it is not possible to provide sufficient interval between respective oscillation wavelengths since the active layers of the respective laser diodes have the identical chemical composition. In addition, the respective laser diodes have a structure wherein the wave guide confines the light only in a direction perpendicular to the hetero-boundaries thereby rendering unstable the lateral transverse modes.

It is therefore an object of the present invention, to provide a semiconductor laser device wherein laser diodes emitting light beams different in wavelength have sufficient interval therebetween and are integrated on the same substrate.

It is another object of the present invention to provide a semiconductor laser device wherein a plurality of laser diodes are formed with small spacings therebetween and the light emitted by these diodes may be combined in a single optical fiber.

It is a further object of the present invention to provide a semiconductor laser device wherein the lateral transverse modes of the respective laser diodes are stable.

SUMMARY OF THE INVENTION

It is a feature of the present invention to provide a monolithically integrated semiconductor laser device capable of producing a plurality of light beams different in wavelength from each other, said laser device comprising: a semiconductor substrate of a first conductivity type; a plurality of multilayer DH structures formed sequentially on said semiconductor substrate with a separating semiconductor layer of a second conductivity type placed between said respective multilayer DH structures, each of said multilayer DH structures including successively, at least a first cladding semiconductor layer of the first conductivity type, an active semiconductor layer of the first conductivity type, and a second cladding semiconductor layer of the first conductivity type, said active semiconductor layer having a relatively narrower bandgap than those of said first and second cladding semiconductor layers; a diffusion region diffused with the impurity of the second conductivity type to convert the conductivity type of said diffusion region to the second conductivity type, said diffusion region reaching said first cladding semiconductor layer of said multilayer DH structure adjacent to said semiconductor substrate through said plurality of multilayer DH structures and at least one of said separating semiconductor layers, thereby forming, transversely, a plurality of p-n junctions in said active semiconductor layers, each of said p-n junctions causing an active region adjacent to said p-n junction to emit stimulated radiation when forward biased and pumped with a current above threshold; means for receiving voltages to separately forward bias each of said p-n junctions and for applying pumping current thereto; and means for providing feedback of said radiation to said active region.

In accordance with the invention laser beams of different wavelengths, depending on the respective DH structures, are obtained, since a plurality of multilayer structures having a DH structure are integrated in the direction of the layer thickness to cause the bandgaps of respective active layers to vary. P-N junctions are formed as a homojunction in the direction vertical to the layer in respective active layers. The refractive index of the active region, formed adjacent to the p-n junction, is larger than the refractive indices of both sides so that the beam is confined in the active region in a two dimensional direction in order to obtain efficient optical confinement. As the current passes vertically to the p-n junction in the direction of the thin active layer, it is possible to concentrate the currents in a narrow width region. In the respective active regions, it is also possible to pass the excitation current which is electrically independent.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
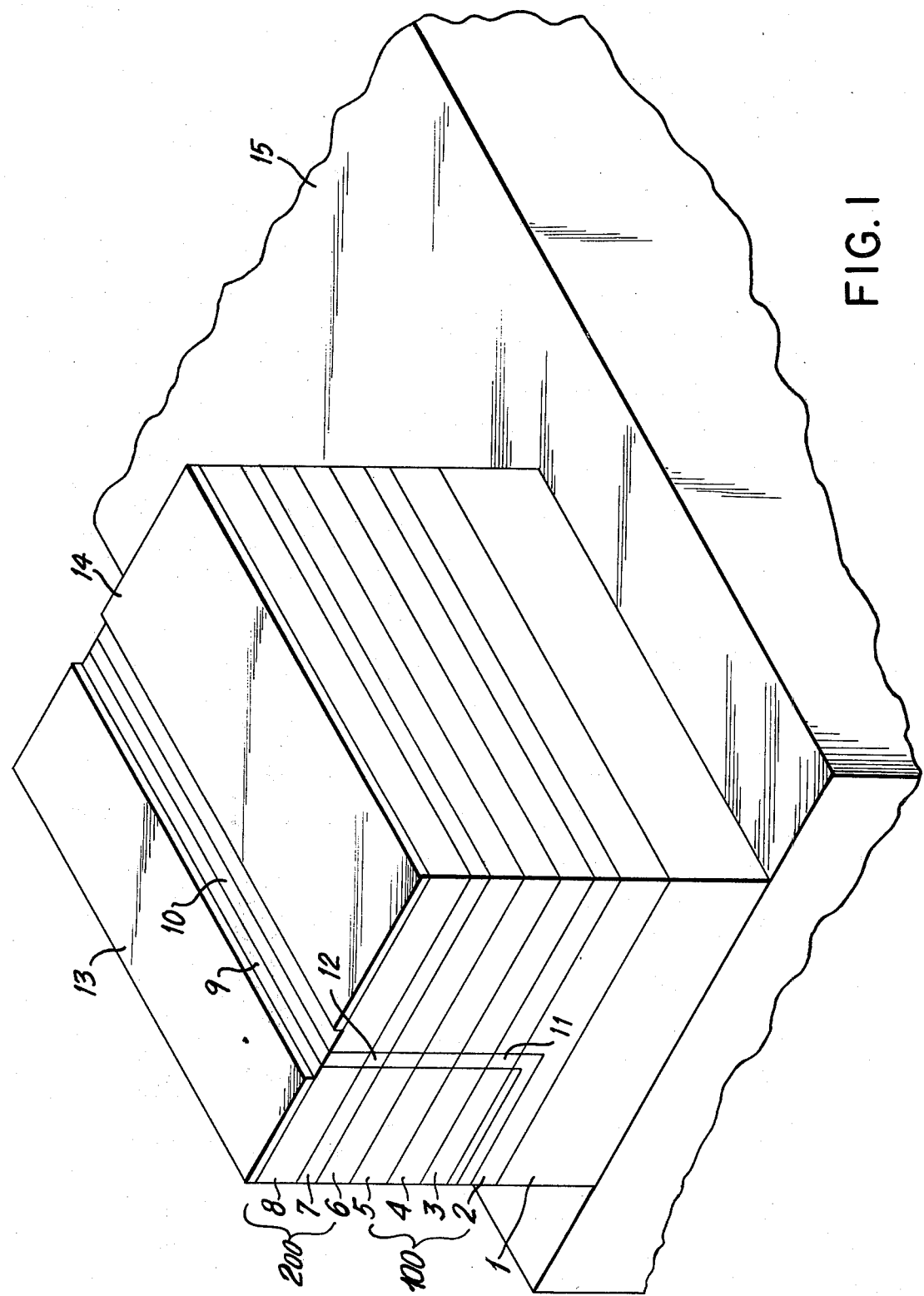
FIG. 1 is a perspective view of an embodiment of the semiconductor laser device according to the present invention.
Figure 2:
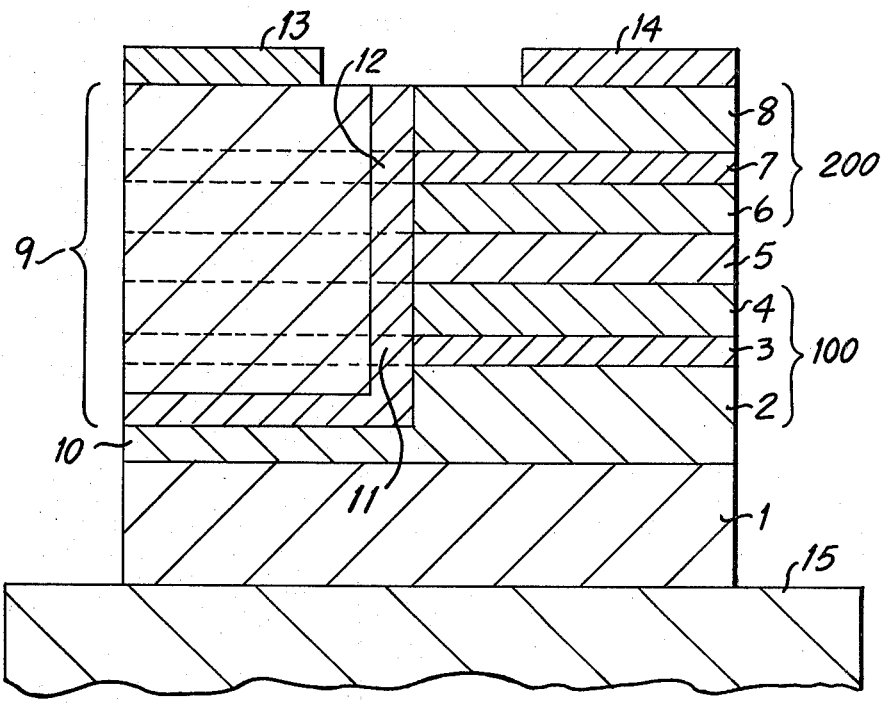
FIG. 2 is a cross sectional view of the embodiment shown in FIG. 1 cut in the direction vertical to the laser beam.

Referring to FIGS. 1 and 2, the semiconductor laser device, according to a first embodiment of the present invention, includes two active regions 11 and 12 separated from each other on an n-GaAs substrate 1. On substrate 1 are integrated a semiconductor multilayer structure 100, an separating semiconductor layer 5 and another semiconductor multilayer structure 200. The semiconductor multilayer structure 100 includes an n-$Ga_{1-y}Al_yAs$ active layer 3, and two n-$Ga_{1-x}Al_xAs$ cladding layers 2 and 4 sandwiching layer 3. The active layer 3 has a band gap narrower than that of the cladding layers 2 and 4 and the separating layer 5. Upon cladding layer 4 is grown a separate semiconductor layer 5 of p-$Ga_{1-x}Al_xAs$, upon which is further grown an n-$Ga_{1-x}Al_xAs$ cladding layer 6, an n-$Ga_{1-y'}Al_{y'}As$ active layer 7, and an n-$Ga_{1-x}Al_xAs$ cladding layer 8. The layers are grown consecutively in the order recited to thereby form the semiconductor multilayer structure 200. The bandgap energy of the active layer 7 is also smaller than those of the cladding layers 6 and 8. The active layer 7 has a bandgap which is different from that of the active layer 3. These layers are epitaxially grown in sequence on the substrate 1 by known methods and thus the growing methods will not be further detailed herein.

The relation of the bandgap and the mixed crystal ratio y in $Ga_{1-y}Al_yAs$ crystal increases monotonously with the increase of y within the scope of $0 \leq y < 0.35$ as reported by Panish, M. B. in the Journal of Applied Physics, Vol. 44, No. 6, June 1973, pp. 2667-2675. The thickness of active layers 3 and 7 is 0.05~0.4 micron. Also Al content y, y' are 0.0 to 0.15 microns with y and y' being different from each other by at least 0.01 microns. This causes the wavelength of oscillation at the two active layers to be different from each other by at least 10 Å. N type impurity, such as Te, is added with a concentration of about $2 \sim 3 \times 10^{18}$ cm$^{-3}$ to these active layers to impart n-type conductivity.

$Ga_{1-x}Al_xAs$ layers, 2, 4, 6 and 8 all become cladding layers of 1 to 2 micron thickness. $Ga_{1-x}Al_xAs$ layer 5 which acts as a separating layer has a 1 to 2 micron thickness. Al content x in these layers is set at 0.3 or above in order to effectively confine the carrier and the beams in the active layers 3 and 7. The value of x is respective layers may be different from each other as the need be. N-type impurity such as Te is added to the layers 2, 4, 6 and 8 in an amount comparable to or less than that added to the active layers 3 and 7 to impart n-type conductivity. To the layer 5 is added p-type impurity such as Cd, with a concentration of about by $1.5 \times 10^{18}$ cm$^{-3}$, to impart the same with p-type conductivity. By diffusing a p-type impurity, such as Zn at a concentration of $10^{19}$ cm$^{-3}$, to a depth which reaches at least the first active layer 3, but not the substrate 1, from above the left-hand side of the multilayer structure, there is formed p+ region 9 indicated by sparse cross hatchings inside the fine solid lines in the figure. Zn is diffused, after sputter evaporizing the $Si_3N_4$ film mask on the right-hand side of the upper crystal surface, at 650° C. with the sealed-off tube method. This causes the active layers 3 and 7, within the region 9, to become conductive up to the surface. By conducting heat treatment, called drive-in diffusion, wherein the crystals diffused with Zn are maintained for about 2 hours at about 900° C., the diffusion front of the p-type impurity is advanced by 0.5 to 2 microns, and there is formed a fine hook shaped p-type region 10. Reference should be made to the paper by H. Namizaki et al printed in IEEE J. Quantum Electronics, Vol. QE-11, No. 7, pp. 427-431 (July, 1975) for the technology of integrating p-n junction in the direction vertical to the active layer. Thus, on active layers 3 and 7, are formed oscillating regions 11 and 12 which have a higher refractive index than that of the outside area. These regions emit laser radiation as current is passed. In this embodiment, the boundary of the p-type region 10 and the non-diffusing region should remain within layer 2 and not reach substrate. This is quite easily achieved in manufacture by keeping the thickness of layer 2 at 1 micron or more. There are also formed, by known technology, an electrode 13 on the surface of the p+ region 9, an electrode 14 on the cladding layer 8 of the second multilayer structure 200 and a heat sink 15, which also acts as an electrode on substrate 1.

In this structure, p-n junctions are of a homojunction type and are formed on the boundary between the p-type impurity diffused region 10 and non-diffused region in the layers 2, 3, 4, 6, 7 and 8, and on the boundary between the layers 5 and 4, and the layers 5 and 6. The p-n junctions in the direction vertical to the layer located within the active layers 3 and 7 are formed within the $Ga_{1-y}Al_yAs$ and $Ga_{1-y'}Al_{y'}As$ crystals having an energy bandgap narrower than other portions. Accordingly, the p-n junctions located in the active layers 3 and 7 have a smaller diffusion potential than that of the p-n junctions of other regions. For this reason, when current is passed between the positive common electrode 13 and the negative individual electrode 15 of the heat sink, or the positive electrode 13 and the negative individual electrode 14, it passes only through the portion of the p-n junction positioned in the active layer 3 or that in the active layer, 7 instead of passing through the p-n junctions in the cladding layers 2, 4, 6 and 8 and the p-n junctions in the horizontal direction between the p-type separative layer 5 and the cladding layers 4 and 6 on both sides thereof. Accordingly, carriers are injected only in the vicinity of the oscillating regions or the active regions 11 and 12.

By appropriately selecting the p-type impurity concentration $n_{p+}$ and $n_p$, respectively, of the high and the low concentration p-type region formed by the drive-in diffusion, as well as the n-type impurity concentration $N_n$ of the narrow bandgap crystal layers 3 and 7 containing the active regions 11 and 12, the refractive indices of the active regions 11 and 12 can be made greater than the areas outside the active regions, thereby to direct the laser beams to become localized in the vicinity of the regions 11 and 12. The reason for this is discussed below. Al content in the active layers 3 and 7 is selected to be lower than that of the cladding layers 2, 4, 6 and 8 so that the refractive index of the active layers is higher than that of the cladding layers as in the case of the conventional type semiconductor laser device having a DH structure.

A further difference in the refractive index appears within respective active layers due to the difference in the impurity concentrations. In each of the n-type and p-type regions, the refractive index generally becomes smaller as the absolute value $|n_p - n_n|$, which is the difference in the impurity concentrations, becomes larger. When the p-type region and the n-type region, having substantially equal $|n_p-n_n|$ are, compared, the p-type region generally has a higher refractive index. As mentioned before, the impurity concentrations $n_{p+}$, $n_p$ and $n_n$ are selected to make $$|n_p-n_n|\lesssim n_n \text{ and } |n_p-n_n|<|n_{p+}-n_n|.$$

The refractive index of the regions 11 and 12 becomes higher than that outside of these regions in the respective narrow-bandgap layers. More specifically, if these values are selected to become $$n_n=2\sim3\times10^{18}\text{ cm}^{-3}, n_{p+}=1\times10^{19}\text{ cm}^{-3},$$
$$n_p=n_n+(1\sim2)\times10^{18}\text{ cm}^{-3}$$

in the DH structure consisting of GaAs and $Al_xGa_{1-x}As$ crystal layers of the embodiment, the refractive index of the regions 11 and 12 becomes larger by about $3\sim7\times10^{-3}$ than those outside of the regions in respective active layers, thereby to cause the laser beams to become localized in the vicinity of these regions.

Accordingly, if the negative individual electrode 15 is connected to the negative electrode of the first power source, and the negative individual electrode 14 to the negative electrode of the second power source, the positive common electrode 13 to the positive electrodes of the respective power source (not shown), the regions 11 and 12 may be independently excited to emit laser radiation. If the end surfaces of the crystals vertical to the optical axis (parallel to the plane of the paper) were made mirrorlike by cleavage, etc. to form a Fabry-Perot resonator, laser oscillation may occur with the regions 11 and 12 respectively as the excited regions.

In this case, if an independent signal current is applied to the negative individual electrodes 15 and 14 respectively, two laser outputs with the regions 11 and 12 as oscillating regions are modulated independently. By varying Al contents y from y' of the active layers 3 and 7, the wavelength of these two laser oscillations may be varied.

Accordingly, this embodiment incorporates two semiconductor lasers which may be excited and modulated independently of each other at two different wavelengths in one semiconductor element. Thickness of the layers 4, 5 and 6 are preferably 1 to 2 microns respectively, with the distance between the oscillation regions 11 and 12 being approximately 3 to 6 microns. As will be apparent from the method of fabrication discussed above, the optical axes of the two semiconductor lasers formed by these two oscillating regions 11 and 12 are parallel to each other. The width, in the lateral transverse direction, of the laser beam emitting regions is as narrow as 2 to 4 microns. Accordingly, by bringing the laser beam emitting end surface of the semiconductor crystal, sufficiently close to the end surface of one optical fiber, the laser output emitted from the above mentioned two regions may be guided into an optical fiber without using a device for combining beams. In other words, it is possible to concurrently recombine the two laser outputs into one optical fiber.

Figure 3:
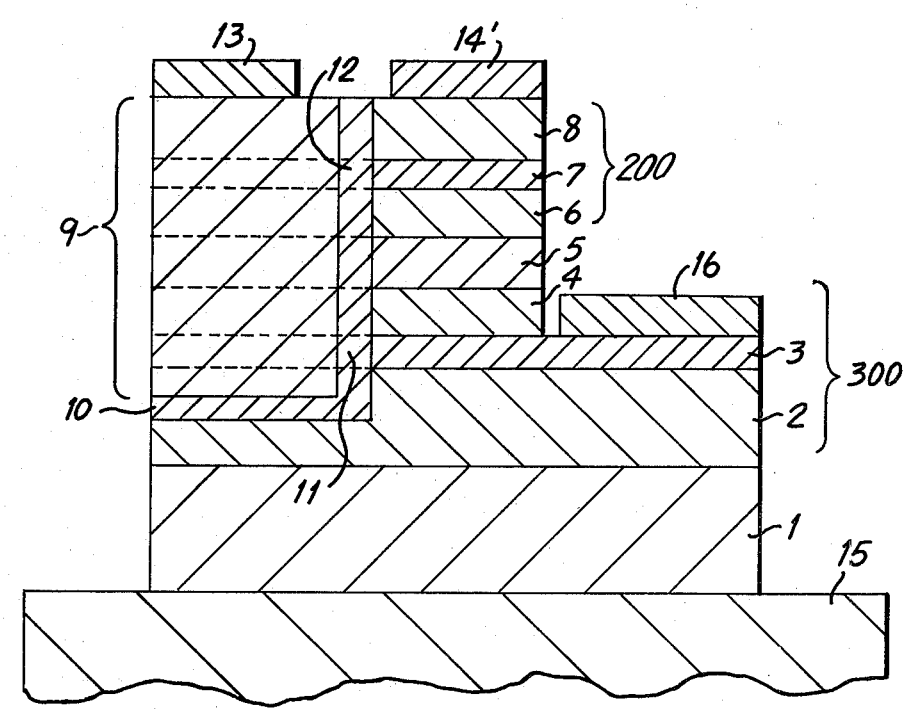
FIGS. 3, 4 and 5 show respectively the second, the third and the fourth embodiments of the present invention, in cross section, cut in the direction vertical to the laser beam.

FIG. 3 is a cross sectional view of a second embodiment of the present invention cut vertically with respect to the laser beam axis. The same parts are denoted with the same numbers as in FIG. 1. In this embodiment multilayer semiconductor crystals are fabricated in a manner similar to that of the first embodiment wherein p-type impurities are diffused and further subjected to drive-in diffusion, and a portion of the active layer 3 (or of the n type $Ga_{1-x}Al_xAs$ layer 4) is exposed by etching to form a negative individual electrode 16. The positive common electrode 13 and the negative individual electrode 14 are also formed on the upper surface of the crystal as in the case of the first embodiment. In this structure, it is possible to excite and modulate the output of the two semiconductor lasers independently from each other by keeping the positive common electrode 13 at the positive constant voltage and by applying the independent negative signal current to the negative individual electrodes 13 and 14.

When a semi-insulating substrate is used as a GaAs substrate in this embodiment, a Zn diffusion front may be allowed to reach the substrate. This is because the current passing p-n junction formed within the substrate is negligible.

Figure 4:
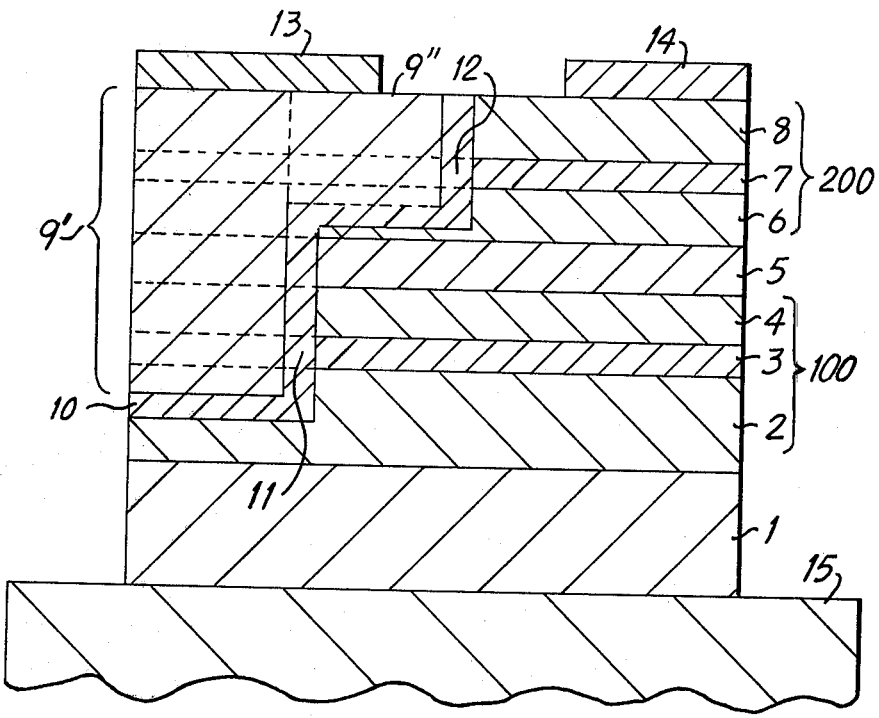

FIG. 4 shows a cross section of a third embodiment of the present invention cut vertically with respect to the laser beam axis. This embodiment is basically the same in construction as the first embodiment, but it is different in that the depths of the impurities diffused from the crystal surface differ depending on their locations. Such diffusion is performed by twice conducting the impurity diffusions, causing the first diffusion on the left side to reach the first active layer 3, forming the first p+ region 9', and then a second diffusion on the right hand side, of several to several tens of microns in width, to reach a depth well above the first active layer 3, but passing the second active layer to form the second p+ region 9". By conducting drive-in diffusion, following these two diffusions, oscillating regions 11 and 12 are respectively formed within the active layers 3 and 7.

When such diffusions are conducted, the two oscillating regions 11 and 12 become separated from each other, not only in the thickness direction of the crystal, but also in the lateral direction and spatially. This causes the mutual interference of the laser oscillations in the different oscillating regions, to decrease and the heat generated in the two oscillating regions becomes more effectively discharged outside the crystals, thereby achieving the purpose of reducing the temperature rise in the semiconductor laser active region.

For decreasing the optical coupling in the different oscillating regions, it is effective, for example, to increase the thickness of three layers 4, 5 and 6, located between the two active layers 3 and 7, to at least 2 to 3 microns.

It will be clear that the embodiment shown in FIG. 4 may be applicable to the construction of the embodiment shown in FIG. 3.

Figure 5:
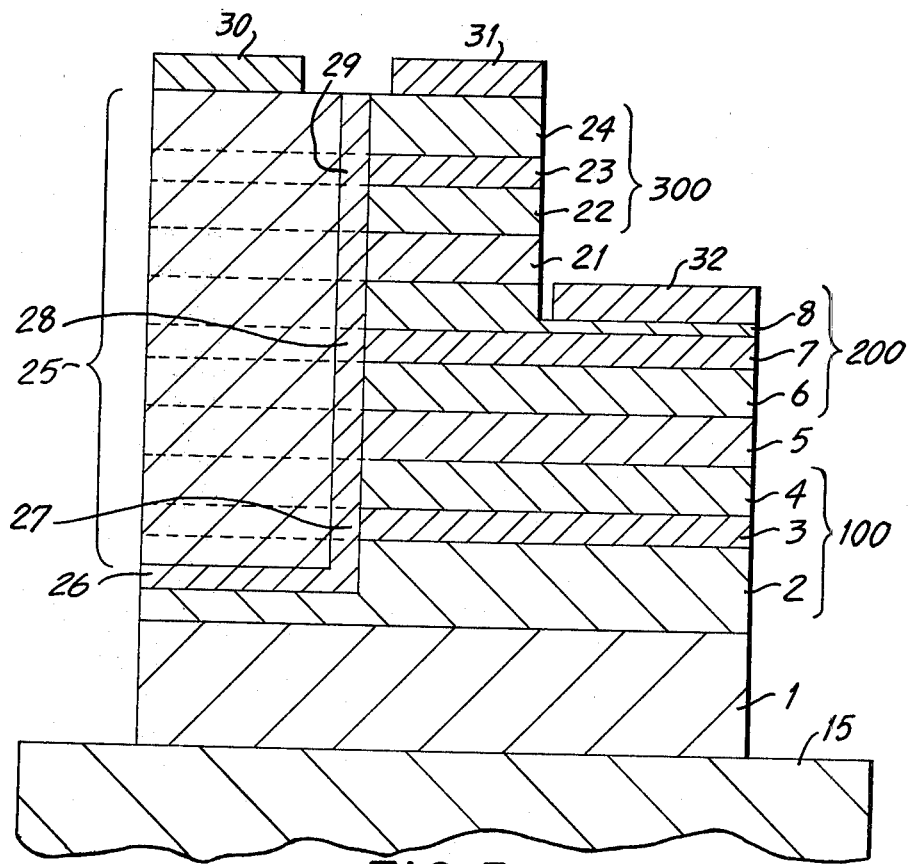

FIG. 5 shows a cross sectional view of a fourth embodiment of the present invention cut vertically with respect to the optical axis. The device of FIG. 5 is contrived so as to enable emission of the laser beams having three different wavelengths. Structure-wise, the embodiment of FIG. 5 combines the structures of FIG. 2 and FIG. 3. Up to step of forming the layers 1 to 8 on the substrate layer 1 is identical to that described in connection with FIG. 1. There are grown sequentially and epitaxially p-type $Ga_{1-x}Al_xAs$ layer 21, n-type $Ga_{1-x}Al_xAs$ layer 22, n-type $Ga_{1-y''}Al_{y''}As$ layer 23, which is the third active layer, and n-type $Ga_{1-x}Al_xAs$ layer 24. Value y" is selected to be different from y and y' within the range of 0.0 to 0.15. The layers 22, 23 and 24 form the third multilayer structure 300, while p-$Ga_{1-x}Al_xAs$ layer 21 electrically insulates the second multilayer structure 200 from the third multilayer structure 300.

Similarly, as in the case of the first embodiment, Zn is diffused to form p+ region 25, and p-type region 26 is formed by drive-in diffusion, thereby forming three oscillating regions 27, 28 and 29. Similarly, as in the case of the second embodiment, the layers 8, 21, 22, 23 and 24 are removed by etching to form electrodes 30, 31 and 32. Here three power sources are connected using electrode 30 as the positive common electrode, heat sink 15 and electrodes 31 and 32 as the negative individual electrodes, and each of the active regions may be excited and modulated independently of each other.

Similarly, by sequentially piling laser elements of double heterostructure, comprising n-type cladding layers sandwiching an n-type active layer, it is possible to obtain a laser element capable of providing laser beams of many different wavelengths. For instance, it becomes feasible to conduct effective optical multiplex communications if the desired energy bandgap is consecutively set at intervals of 2 to 20 meV.

According to the structures illustrated by way of embodiments 1 to 4, two or more oscillating regions are located within a distance of several tens of microns from each other and their optical axes are parallel to each other. With this structure it is possible to combine all the laser output beams concurrently in one multimode optical fiber having a core diameter of 100 to 150 microns.

The description given above with respect to the first to the fourth embodiments involved the case where the crystals are (Ga, Al) As. Other semiconductor crystals such as (In, Ga) (As, P), which may be made to have double heterostructure, may also be used in combination. When the active layer is of (In, Ga) (As, P) crystals, InP crystals which have the wider energy bandgap than the active layer are used as the substrate. In such a case, the impurity diffusion region 10 or 9 (25 or 26) may reach the substrate 1 in the structure shown in FIGS. 1 to 4.

If it is possible to fabricate crystals having a low impurity concentration and with sufficiently low electric conductivity as the cladding layers 2, 4, 5, 6 and 8 in the embodiment in FIG. 3, leakage current at the p-n junctions below the oscillating regions 11 and 12 may be curtailed. If it is possible to fabricate the cladding layers from a higher electric insulation, the layers 4, 5 and 6, sandwiched between the active layers, may be replaced by this single electrically insulating layer.

It is also possible with respect to the first and the second embodiments, to decrease the Al content in part or all of the n-type cladding layers 2, 4 and 6 to a degree which would prevent carrier leakage, from adjacent active layers, from becoming too large and to achieve what is called Large Optical Cavity Structure. The feed-back of beams for laser oscillation may be achieved by the distributed-feedback method, with optical grating being formed on the active layer, or on the adjacent crystal layers, instead of reflection at the end surfaces of the crystals.

The above explanation has been given with respect to a laser having n-type DH structure layers diffused with p type impurity, but it is axiomatic that the present invention may be also applied to a laser with p type DH structure layers diffused with p-type impurity. In such a case, however, the semiconductor layer used for insulating (5 in FIG. 1) would not be p-type, but would be n-type.

Although a specific embodiment of this invention has been shown and described, it will be understood that various modifications may be made without departing from the spirit of this invention.

What is claimed is:

1. A monolithically integrated semiconductor laser device capable of providing a plurality of light beams, each light beam being different in wave length, said laser device comprising:

a semiconductor substrate of a first conductivity type a plurality of multi-layer double heterostructures, formed sequentially on said semiconductor substrate, and having a separating semiconductor layer of a second conductivity type formed between said respective multi-layer double hetero-structures, each of said multi-layer double hetero-structures including successively, at least a first cladding semiconductor layer of the first conductivity type, an active semiconductor layer of the first conductivity type, and a second cladding semiconductor layer of the first conductivity type, said active semiconductor layer having a relatively narrower bandgap than those of said first and second cladding semiconductor layers;

a diffusion region diffused with the impurity of the second conductivity type to convert the conductivity type of said diffusion region to said second conductivity type;

said diffusion region reaching said first cladding semiconductor layer of said multi-layer double heterostructure, adjacent to said semiconductor substrate, and through said plurality of multi-layer double hetero-structures and at least one of said separating semiconductor layers, thereby forming transversely a plurality of p-n junctions in said active semiconductor layers, each of said p-n junctions causing an active region adjacent to said p-n junction to emit stimulated radiation when said p-n junctions are forward biased and pumped with current above a threshold current level;

means for separately forward biasing each of said p-n junctions and for applying current thereto; and means for providing feedback of said stimulated radiation to said active region.

2. A monolithically integrated semiconductor laser device as claimed in claim 1, wherein a front portion of said diffusion region is extended to produce an extended portion with the diffused impurity concentration of said extended portion being substantially lower than that of the originally diffused region, whereby said p-n junctions are formed at the front of said extended portion.

* * * * *